United States Patent
Xie et al.

(10) Patent No.: US 11,812,568 B2
(45) Date of Patent: Nov. 7, 2023

(54) FOLDABLE DISPLAY DEVICE

(71) Applicant: HuiZhou TCL Mobile Communication Co., Ltd., Guangdong (CN)

(72) Inventors: Yongqiu Xie, Guangdong (CN); Yiju Chen, Guangdong (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 232 days.

(21) Appl. No.: 17/435,769

(22) PCT Filed: Oct. 23, 2019

(86) PCT No.: PCT/CN2019/112642
§ 371 (c)(1),
(2) Date: Sep. 2, 2021

(87) PCT Pub. No.: WO2020/224193
PCT Pub. Date: Nov. 12, 2020

(65) Prior Publication Data
US 2022/0159856 A1    May 19, 2022

(30) Foreign Application Priority Data
May 6, 2019 (CN) .......................... 201910371138.5

(51) Int. Cl.
*H05K 5/00* (2006.01)
*H05K 5/02* (2006.01)
*F16C 11/04* (2006.01)

(52) U.S. Cl.
CPC ............ *H05K 5/0226* (2013.01); *F16C 11/04* (2013.01); *H05K 5/0017* (2013.01)

(58) Field of Classification Search
None
See application file for complete search history.

(56) References Cited

U.S. PATENT DOCUMENTS 9,348,450 B1 *    5/2016   Kim ..................... H04M 1/0268
9,600,035 B2 *    3/2017   Park ....................... G06F 1/1681
10,133,303 B2    11/2018  Park et al.
(Continued)

FOREIGN PATENT DOCUMENTS

| CN | 105448194 | 3/2016 |
| CN | 106462194 | 3/2016 |

(Continued)

OTHER PUBLICATIONS

International Search Report and the Written Opinion dated Feb. 12, 2020 From the International Searching Authority Re. Application No. PCT/CN2019/112642 and its Translation of Search Report Into English. (13 Pages).

(Continued)

*Primary Examiner* — Anthony Q Edwards
*Assistant Examiner* — Rashen E Morrison

(57) ABSTRACT

A foldable display includes a body, a main screen, and an auxiliary screen. The main screen and the auxiliary screen are connected by a foldable mechanism transformable between a folded state and an unfolded state. In the unfolded state, the main screen and the auxiliary screen are sided together to transform into a whole screen.

16 Claims, 5 Drawing Sheets

(56) References Cited

U.S. PATENT DOCUMENTS

| | | |
|---|---|---|
| 10,466,747 B2 | 11/2019 | Yun et al. |
| 10,761,572 B1 * | 9/2020 | Siddiqui ............... G06F 1/1681 |
| 10,761,573 B2 | 9/2020 | Hsu |
| 10,975,603 B2 | 4/2021 | Tazbaz |
| 2021/0141422 A1 | 5/2021 | Seo et al. |

FOREIGN PATENT DOCUMENTS

| | | |
|---|---|---|
| CN | 105448194 | 2/2017 |
| CN | 106462194 | 2/2017 |
| CN | 107092303 | 8/2017 |
| CN | 207399685 | 5/2018 |
| CN | 108428408 | 8/2018 |
| CN | 109308847 | 2/2019 |
| CN | 109441941 | 3/2019 |
| CN | 109469680 | 3/2019 |
| CN | 109681521 | 4/2019 |
| CN | 208734715 | 4/2019 |
| CN | 109949707 | 6/2019 |
| KR | 20180094172 | 8/2018 |
| KR | 20180116722 | 10/2018 |

OTHER PUBLICATIONS

Notification to Grant Patent Right for Invention dated Mar. 2, 2021 From The State Intellectual Property Office of the People's Republic of China Re. Application No. 201910371138.5 and Its Translation Into English. (6 Pages).

Supplementary European Search Report and the European Search Opinion Dated Jun. 30, 2022 From the European Patent Office Re. Application No. 19928085.0. (11 Pages).

* cited by examiner

FOLDABLE DISPLAY DEVICE

RELATED APPLICATIONS

This application is a National Phase of PCT Patent Application No. PCT/CN2019/112642 having International filing date of Oct. 23, 2019, which claims the benefit of priority of Chinese Patent Application No. 201910371138.5 filed on May 6, 2019. The contents of the above applications are all incorporated by reference as if fully set forth herein in their entirety.

FIELD AND BACKGROUND OF THE INVENTION

The present application relates to display technology field, in particular, to a foldable display.

BACKGROUND

In recent years, development of display technology has made portable terminals such as mobile phones and tablet computers extremely popular. However, with increasing sizes of displays on the mobile phones, tablet computers, and other portable terminals, these terminal devices have become less portable.

Also, in a continuously developing mobile phone market, need for data services has surpassed need for voice services. That is, smart phones have occupied a dominant position. However, innovation of smart phones for specific fields is still insufficient. For multimedia and network applications, screens of mainstream mobile phones are too small and inconvenient to use. If a screen of a straight mobile phone is made into a whole screen, it may consume a lot of power and suffer from lack of endurance. A flip phone may be able to expand the screen, but such an innovation is not satisfactory as usages of multimedia services in various particular situations are still inconvenient.

At present, the smart phone market tends to be homogenized following a rhythm of mainstream host manufacturers. Pursuit of full screen has become a prevailing tide, and all big players in the industry continue to compete in development of notch screens and waterdrop screens, making mobile phone products uninterestingly featureless. This is mainly due to a lack of innovation and technical barriers in industrial design of mobile phones.

SUMMARY OF THE INVENTION

The embodiment of the application provides a foldable display, which can improve the folding reliability.

A detailed description is given in the following embodiments with reference to the accompanying drawings. In the first aspect, the embodiment of the application provides a foldable display comprising a body, a main screen and an auxiliary screen, wherein the main screen and the auxiliary screen are connected by a foldable mechanism transformable between a folded state and an unfolded state. In the unfolded state, the main screen and the auxiliary screen are sided together to transform into a whole screen.

The purpose of the application and solving the technical problems thereof are realized by adopting the following technical solutions.

In an embodiment of a foldable display, the auxiliary screen may be located on the body.

In the folded state, the main screen may be stacked on the auxiliary screen.

In an embodiment of a foldable display, a middle portion of the whole screen may be crimped and clung to an inner surface of the foldable mechanism.

In an embodiment of a foldable display, the main screen and the auxiliary screen may be touch screens.

In an embodiment of a foldable display, the foldable mechanism may comprise: two synchronous geartrain hinges, configured to transmit forces by a plurality of gears; a central folding joint, covered by the two synchronous geartrain hinges, arranged as a central part of a symmetric structure; two secondary folding joints, fixed on either sides of the central folding joint by screws; a head component and a tail component, respectively attached to the secondary folding joints by screws; a shell of the main screen, attached to an outer side of the head component; a shell of the auxiliary screen, attached to an outer side of the tail component; and a central cover plate, configured to cover the two synchronous geartrain hinges by screws, support the whole screen, and prevent the whole screen from contacting the gears.

In an embodiment of a foldable display, the synchronous geartrain hinges may be a symmetrical design comprising a central base; an active primary bracket; an active geartrain; an active secondary bracket; a passive secondary bracket; a passive geartrain; and a passive primary bracket.

In an embodiment of a foldable display, the central base may comprise: a central rotating geartrain, comprising a main stay, a central driving geartrain composed of four gears, and a pair of gear supporters supporting the four gears, wherein: the main stay has a bottom fixed on the central folding joint by screws, and the main stay has racks axially symmetrically allocated on the main stay and below the active geartrain and the passive geartrain, respectively meshing with gears in the active geartrain and the passive geartrain.

In an embodiment of a foldable display, the active primary bracket may comprise: two brackets fixedly connected by screws; a first end, having a limiting arc-shaped chute matched with a fixed shaft of the active secondary bracket for sliding on a fixed track, and a second end, directly fixedly attached to the tail component and the shell of the auxiliary screen by screws.

In an embodiment of a foldable display, the active geartrain may comprise: four gears sequentially arranged and meshed in a row; wherein: a front gear of the four gears may be meshed with racks on the active primary bracket, transmitting forces to a rear gear of the four gears via intermediate gears of the four gears; and the rear gear may be meshed with racks on the main stay, driving the main stay to perform a rotational motion on a fixed track.

In an embodiment of a foldable display, the active secondary bracket may comprise five brackets fixedly connected in a row, each respectively attached by screws to provide rotation support on either ends of the active geartrain, performing the rotational motion together with the rear gear meshed with the racks on the main stay.

In an embodiment of a foldable display, the passive secondary bracket may comprise five brackets and may be axially symmetric with the active secondary bracket.

In an embodiment of a foldable display, the passive geartrain may comprise four gears sequentially arranged and meshed in a row, wherein a front gear of the four gears receives driving forces generated by overturning the passive secondary bracket, and transmits the driving forces to a rear gear of the four gears through intermediate gears of the four gears.

In an embodiment of a foldable display, the passive primary bracket may comprise: two brackets axially symmetrical with the active primary bracket; a first end having a limiting arc-shaped chute matched with a fixed shaft of the passive secondary bracket to enable sliding on a fixed track; a second end, fixedly connected to the head component and the shell of the main screen; wherein the bracket has racks meshed with the rear gear so as to rotate responsively.

In an embodiment of a foldable display, when the foldable display may be folded: the tail component and the shell of the auxiliary screen may be flipped by driving force, driving the active primary bracket to move along the limiting arc-shaped chute; the racks on the bracket may be drive the active geartrain to rotate, so that the rear gear meshed with the racks on the main stay may be rotated to overturn the active secondary bracket along the limiting arc-shaped chute; the racks on the bracket may synchronously drive the gear to rotate, causing the racks on the main stay to transfer the driving force from the gear to the gear, driving the racks on the bracket meshed with the gear to move the passive secondary bracket along the limiting arc-shaped chute; the racks of the main stay may synchronously drive the front gear of the passive geartrain to rotate, causing the front gear to transfer the driving force to the rear gear; and the head component and the shell of the main screen are synchronously overturned by the driving force transferred from the rear gear meshed with the racks on the bracket.

In an embodiment of a foldable display, in the folding process, the shell of the main screen may be kept relatively still; the driving force may be applied on the shell of the auxiliary screen, driving the foldable mechanism to fold, so that the inner surface of the foldable mechanism may be bended to form an arc surface with a circumference equal to the length of the inner surface of the foldable mechanism in the unfolded state, allowing the lengths of the shells of the auxiliary screen, the main screen, and the inner surface of the foldable mechanism to remain unchanged during the folding process.

In an embodiment of a foldable display, the folded portion of the foldable mechanism may be an arc surface.

In an embodiment of a foldable display, the body comprises a camera, a USB interface, and a Bluetooth unit.

In an embodiment of a foldable display, the main screen and the auxiliary screen have subsequently identical dimensions with junctions of the same size.

In the second aspect, the embodiment of the application also provides a foldable display, comprising a body, a main screen and an auxiliary screen, wherein: the main screen and the auxiliary screen are connected by a foldable mechanism transformable between a folded state and an unfolded state; in the unfolded state, the main screen and the auxiliary screen are sided together to transform into a whole screen, and the auxiliary screen may be located on the body; and in the folded state, the main screen may be stacked on the auxiliary screen, and a middle portion of the whole screen may be crimped and clung to an inner surface of the foldable mechanism.

In an embodiment of a foldable display, the auxiliary screen may be located on the body; in the folded state, the main screen may be stacked on the auxiliary screen; and a middle portion of the whole screen may be crimped and clung to an inner surface of the foldable mechanism.

Beneficial Effect

The foldable display according to an embodiment of the present application completely subverts the industrial design of the traditional screen, and brings unprecedented changes in user experience and interaction. It is easy to carry and store in the folded state, and the high-quality whole screen experience can be obtained in the unfolded state. Meanwhile, the two states can be switched to and from freely. The synchronous geartrain designed foldable mechanism is reliable and stable in the folding movement of the screen, and can rotate freely in a certain angle; the synchronous gear folding display is installed and uniformly fit in the folded state between the main screen shell and the auxiliary screen shell, as well as between the foldable mechanism and the screen. The visual effect of folding process is smooth and beautiful, and the bending performance requirements of folding terminal for screen are reduced, thereby improving the bending reliability.

BRIEF DESCRIPTION OF THE SEVERAL VIEWS OF THE DRAWINGS

The present invention can be more fully understood by reading the subsequent detailed description and examples with references made to the accompanying drawings, wherein.

DETAILED DESCRIPTION OF SPECIFIC EMBODIMENTS OF THE INVENTION

Figure 1A:
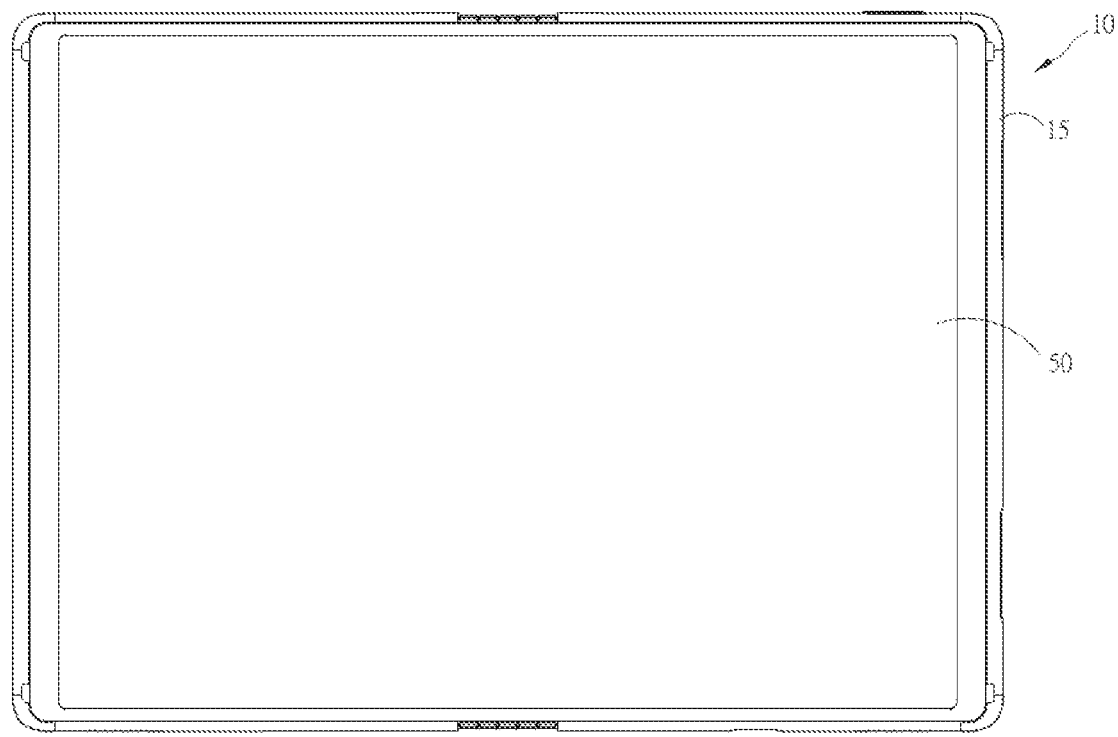
FIG. 1a is a first diagram of a foldable display in an unfolded state according to an embodiment of the present application.

The following description of each embodiment is referred to the attached schema to illustrate specific embodiments that can be implemented by the present application. The directional terms mentioned in this application, such as "up", "down", "front", "back", "left", "right", "inside", "outside" and "side" are only the directions of the attached schema. Therefore, the directional language is used to explain and understand the application, rather than to limit the application.

The drawings and illustrations are considered to be illustrative in nature rather than restrictive. In the graph, cells with similar structure are represented by the same label. In addition, for the sake of understanding and easy description, the size and thickness of each component shown in the drawings are arbitrarily shown, but the present application is not limited to this.

In addition, in the specification, unless explicitly described to the contrary, the word "comprising" may be understood to mean comprising the component, but does not exclude any other component. In addition, in the specification, "on" means to be above or below the target component, not to mean that it must be on the top based on the direction of gravity.

In order to further elaborate the technical means and functions adopted by the application to achieve the intended purpose of the invention, the specific implementation mode, structure, features and functions of the foldable display proposed according to the application are described in detail as follows in combination with the drawings and specific embodiments.

Figure 1B:
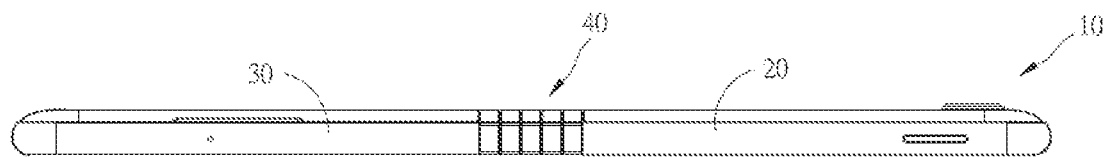
FIG. 1b is a second diagram of the foldable display in the unfolded state according to an embodiment of the present application.
Figure 2A:
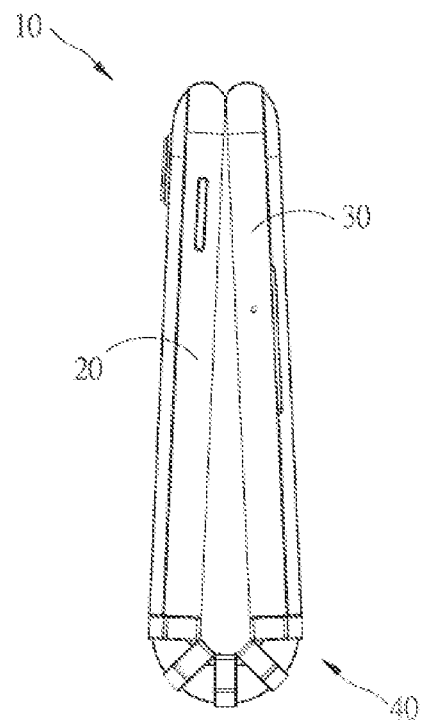
FIG. 2a is a first diagram of the foldable display in a folded state according to an embodiment of the present application.
Figure 2B:
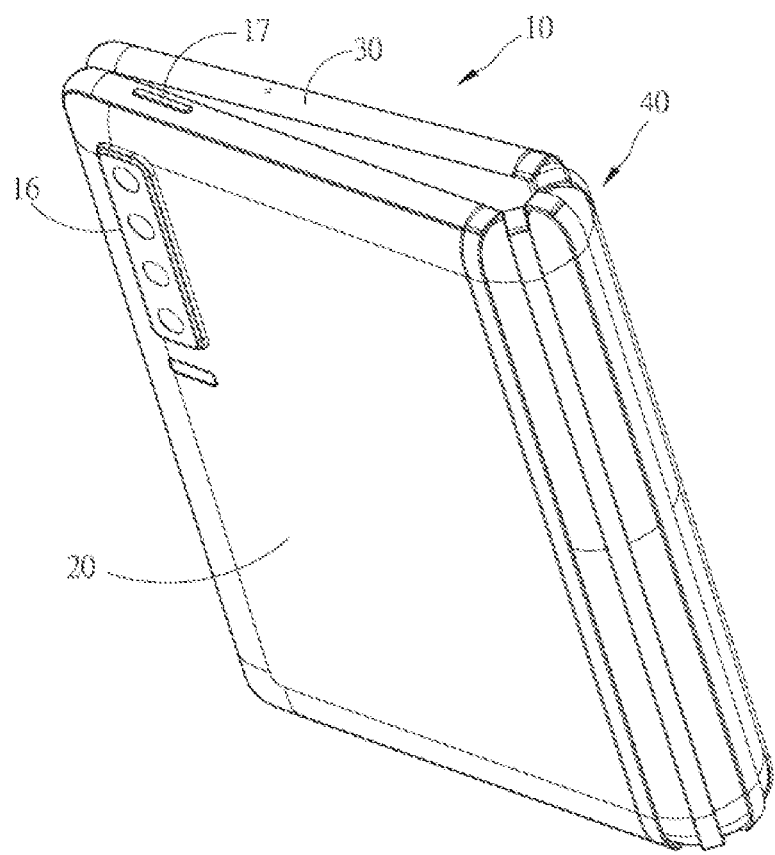
FIG. 2b is a second diagram of the foldable display in the folded state according to an embodiment of the present application.
Figure 3:
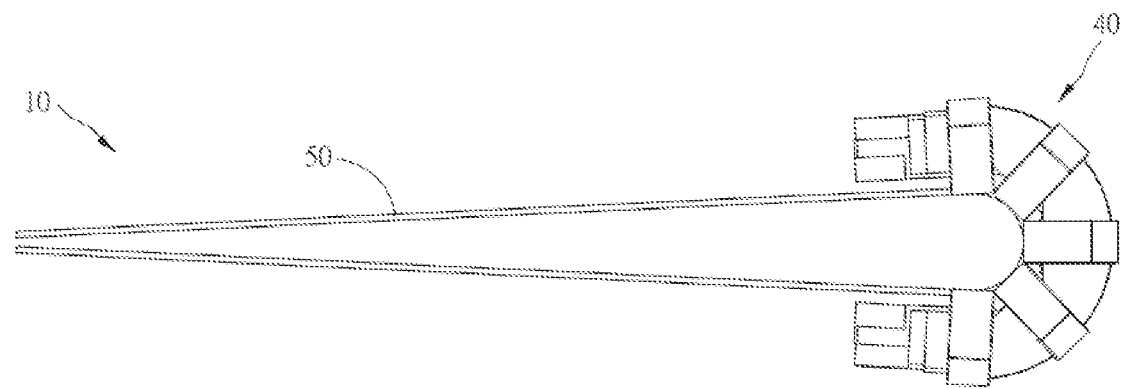
FIG. 3 is a first folded state diagram of a foldable mechanism in the foldable display according to an embodiment of the present application.

FIG. 1a is a first diagram of a foldable display in an unfolded state according to an embodiment of the present application. FIG. 1b is a second diagram of the foldable display in the unfolded state according to an embodiment of the present application. FIG. 2a is a first diagram of the foldable display in a folded state according to an embodiment of the present application. FIG. 2b is a second diagram of the foldable display in the folded state according to an embodiment of the present application. FIG. 3 is a first folded state diagram of a foldable mechanism in the foldable display according to an embodiment of the present application. Referring to FIGS. 1a, 1b, 2a, 2b and 3, in the embodiment of the present application, a foldable display 10 comprises a body 15, a main screen 20, and an auxiliary screen 30. The main screen 20 and the auxiliary screen 30 are connected by a foldable mechanism 40 transformable between a folded state and an unfolded state. After unfolding, that is, in the unfolded state, the main screen 20 and the auxiliary screen 30 are sided together to transform into a whole screen 50.

In an embodiment of the present application, the auxiliary screen 30 is located on the body 15, and after folding into the folded state, the main screen 20 is stacked on the auxiliary screen 30.

In an embodiment of the present application, a middle portion of the whole screen 50 is crimped and clung to an inner surface of the foldable mechanism 40.

In an embodiment of the present application, the main screen 20 and the auxiliary screen 30 are touch screens.

In an embodiment of the present application as shown in FIG. 1a and FIG. 1b, the folding action of the whole body is mainly realized by an innovative synchronous gear foldable mechanism. When the whole body is unfolded, the unfolded screens are expanded into a plane, which can be used as a flat panel. When the whole body is in the folded state as shown in FIG. 2a and FIG. 2B, the foldable mechanism can be folded 180-190 degrees along a rotating shaft, and an arc-shaped bending area can be formed in the middle portion to wrap the middle portion of the whole screen 50. During the folding process of the foldable mechanism, the lengths of the shells of the main screen 20, the auxiliary screen 30, and the foldable mechanism inner surface remains unchanged. The middle portion of the whole screen 50 is bended and snapped to the inner surface of the foldable mechanism, so that the length of the whole screen 50 remains unchanged, as shown in FIG. 3.

Figure 4:
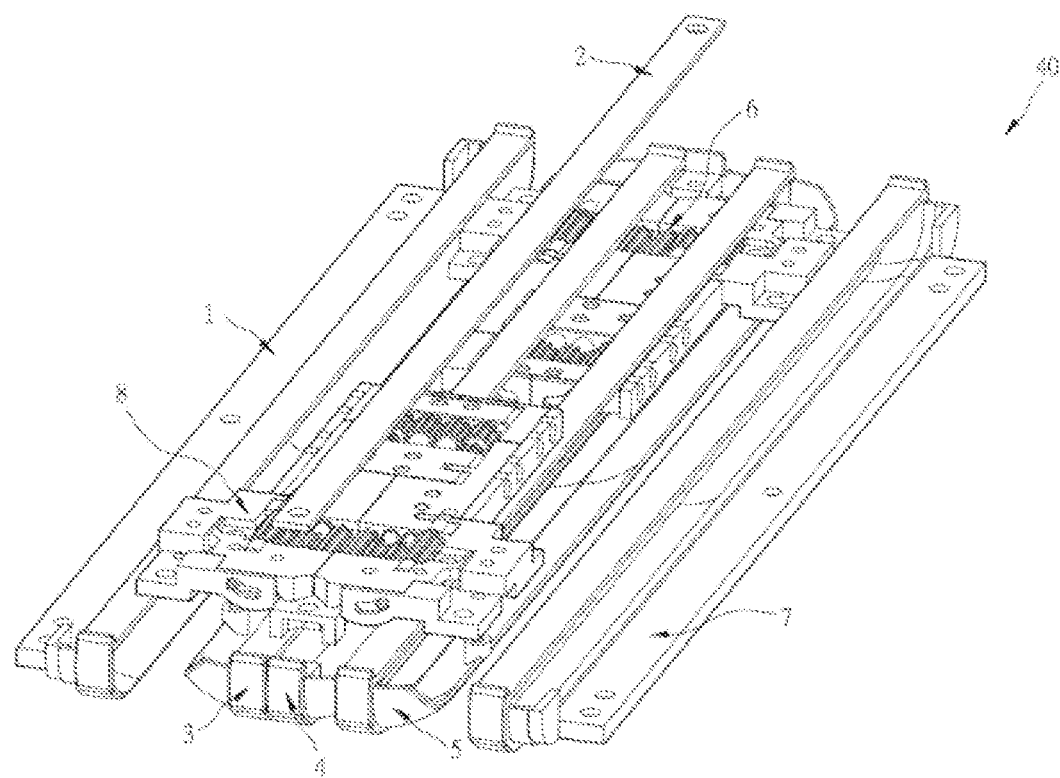
FIG. 4 shows an explosion structure diagram of the foldable mechanism in the foldable display according to an embodiment of the present application.
Figure 5:
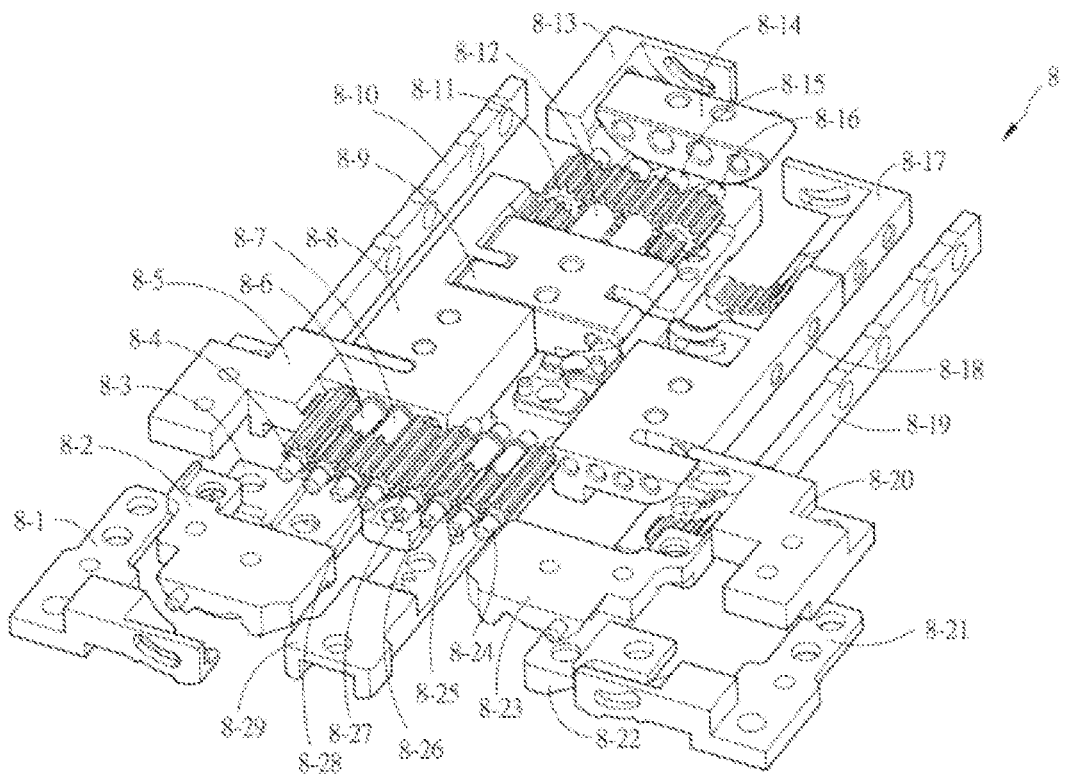
FIG. 5 shows an explosion structure diagram of synchronous geartrain hinges in the foldable display according to an embodiment of the present application.
Figure 6:
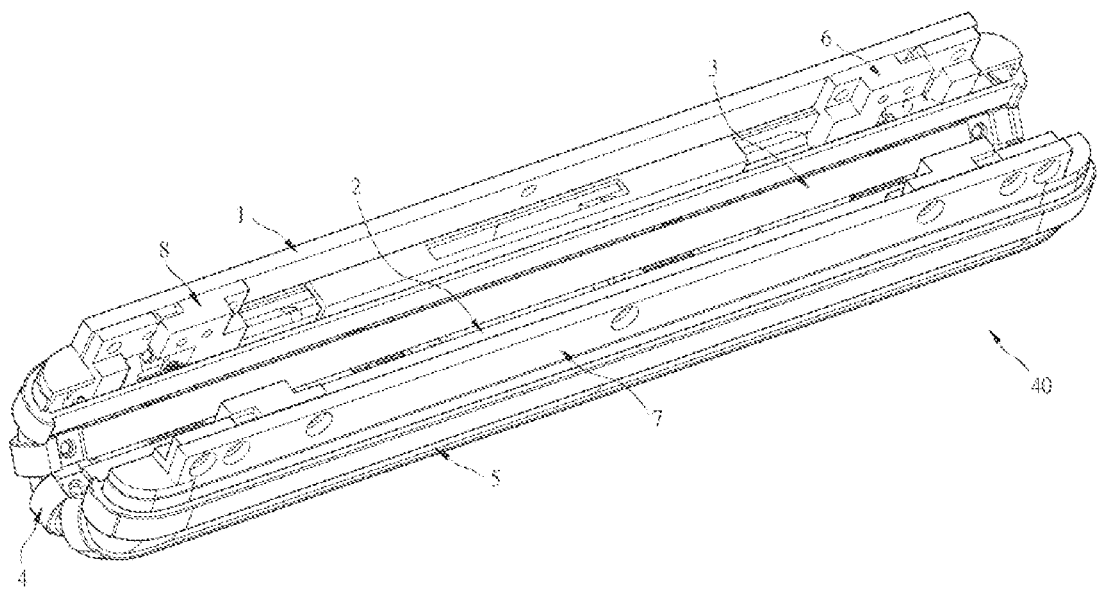
FIG. 6 shows a second folded state diagram of the foldable mechanism in the foldable display according to an embodiment of the present application.

FIG. 4 shows an explosion structure diagram of the foldable mechanism in the foldable display according to an embodiment of the present application, FIG. 5 shows an explosion structure diagram of the synchronous geartrain hinges in the foldable display according to an embodiment of the present application, and FIG. 6 shows a second folded state diagram of the foldable mechanism in the foldable display according to an embodiment of the present application. Please refer to FIG. 1b and FIG. 4. In the embodiment of the present application, the foldable mechanism 40 comprises two sets of synchronous geartrain hinges 6 and 8, configured to transmit the driving forces by a plurality of gears; a central folding joint 4 is connected to and covered by the two sets of synchronous geartrain hinges 6 and 8, arranged as a central part of a symmetric structure. and the two secondary folding joints 3 and 5 are respectively connected to the central folding joint 4 by screws on both sides. One end of a head component 7 is connected to the shell of the main screen 20, and one end of a tail component 1 is connected to the shell of the auxiliary screen 30. A central cover plate 2 is configured to cover the two synchronous geartrain hinges 6 and 8 by screws, which can not only support the whole screen 50, but also prevent the whole screen 50 from contacting the gears.

Please refer to FIG. 1b, FIG. 4, and FIG. 5. In the embodiment of the present application, the hinge 8 of the synchronous geartrain is designed to be a symmetrical structure, mainly composed of a central base, an active primary bracket, an active geartrain, an active secondary bracket, a passive secondary bracket, a passive geartrain, and a passive primary bracket. Wherein, the central base comprises a main stay 8-29, a central driving geartrain composed of four gears 8-11, 8-12, 8-15, and 8-16, and a pair of gear supporters 8-9 and 8-14. The main stay 8-29 has a bottom fixed on the central folding joint 4 by screws. On the main stay 8-29, there are axisymmetric designed racks, respectively meshed with the gears 8-27 and 8-28 in the active and passive geartrains. The active primary bracket comprises two brackets 8-1 and 8-5 fixedly connected by screws. A first end of the active primary bracket has a limiting arc-shaped chute matched with a fixed shaft of the active secondary bracket for sliding on a fixed track. A second end of the active primary bracket is directly fixedly attached to the tail component 1 and the shell of the auxiliary screen 30 by screws.

The active geartrain consists of four gears 8-4, 8-6, 8-7 and 8-28 sequentially arranged and meshed in a row. The front gear 8-4 is meshed with the racks 8-5 on the active primary bracket, transmitting the driving force through the middle two gears 8-6 and 8-7. The rear gear 8-28 is meshed with the racks on the main stay 8-29, so the rear gear 8-28 may drive the main stay 8-29 to perform a rotational motion on a fixed track. The active secondary bracket comprises five fixedly connected brackets 8-2, 8-3, 8-8, 8-10 and 8-13, of which the bracket 8-3 is fixedly connected to the bracket 8-2 and 8-8 by screws respectively to provide support on two ends for the middle active geartrain to rotate. The brackets 8-8 and 8-13 are connected by screws. The brackets 8-8 and 8-13, similar to the active primary bracket, each has one end configured with a limiting arc-shaped chute bounded with the fixed shafts on the central base support 8-9 and 8-14 to perform a fixed track sliding synchronous to the movement of the rear gear 8-28. The support 8-8 is equipped with racks meshed with gears on the central base, synchronously moving with the axial movement of the rear gear 8-28. The passive secondary bracket comprises five brackets 8-17, 8-18, 8-19, 8-22, and 8-23, axially symmetric with the active secondary bracket. After receiving the driving force transmitted by the active secondary bracket through the central geartrain engagement, the racks drive the whole passive secondary bracket to make a fixed track overturning movement in the limit chute provided by the central base, and the bracket 8-23 is fixed with the secondary folding joint 5 through screws; the passive geartrain comprises four gears 8-24, 8-25, 8-26, 8-27 sequentially meshed in a line. The front gear 8-27 of the four gears receives driving forces generated by overturning the passive secondary bracket, and transmits the driving forces to a rear gear 8-24 of the four gears through intermediate gears 8-25 and 8-26 of the four gears. The passive primary bracket comprises two brackets 8-20 and 8-21, which are axially symmetric with the active primary bracket. One end of the passive primary bracket is configured with a limiting arc-shaped chute, which can be matched with the fixed shaft of the passive secondary bracket to enable sliding on a fixed track, and the other end is fixedly connected to the head component 7 and the shell of the main screen 20, wherein the bracket 8-20 has racks meshed with the rear gear 8-24 so as to rotate responsively. The above active and passive primary (secondary) supports are axisymmetric design, and the terms "active" and "passive" are merely relative expressions that can be interchanged under different force application conditions.

Please refer to FIG. 1b, FIG. 4, FIG. 5, and FIG. 6. In the embodiment of the present application, during the folding process, the shell of the main screen 20 is kept relatively still, and the driving force is applied on the shell of the auxiliary screen 30 for overturning the foldable mechanism 40, causing the inner surface of the foldable mechanism 40 to bend into an arc, and the circumference of the arc is consistent with the length of the inner surface of the foldable mechanism 40 in the unfolded state, allowing the lengths of the shells of the auxiliary screen 30, the main screen 20, and the inner surface of the foldable mechanism to remain unchanged during the folding process. The outer surface of the foldable mechanism 40 is completely covered by angle wraps, which can not only hide the internal structure and prevent exposure, but also improve the sense of technology and quality of appearance. In this folding process, the driving force is applied to flip the cover of tail component 1 and auxiliary screen 30 to drive the active primary bracket to turn along the limiting arc-shaped chute. Meanwhile, the racks on the bracket 8-5 synchronously drive the active geartrain to rotate, so that the rear gear 8-28 engaged with the fixed rack on the main stay 8-29 is rotated to push the active secondary bracket to flip along the limiting arc-shaped chute. During the folding process, the racks on the bracket 8-8 drives the gear 8-11 to rotate, and the fixed racks on the main stay 8-29 transmit the driving force from the gear 8-11 to gear 8-16. The racks on the bracket 8-18 meshed with the gear 8-16 to move the passive secondary bracket along the limiting arc-shaped chute. The racks of the main stay 8-29 synchronously drive the front gear 8-27 of the passive geartrain to rotate, causing the front gear 8-27 to transfer the driving force to the rear gear 8-24. With the transmission of the driving force generated by the racks on the bracket 8-20 engaged with the rear gear 8-24, the passive secondary bracket starts to rotate along the limiting arc-shaped chute, so that the shell of the main screen 20 flips together with the head component 7. Finally, the synchronous folding process of the foldable display is realized successfully.

Figure 7:
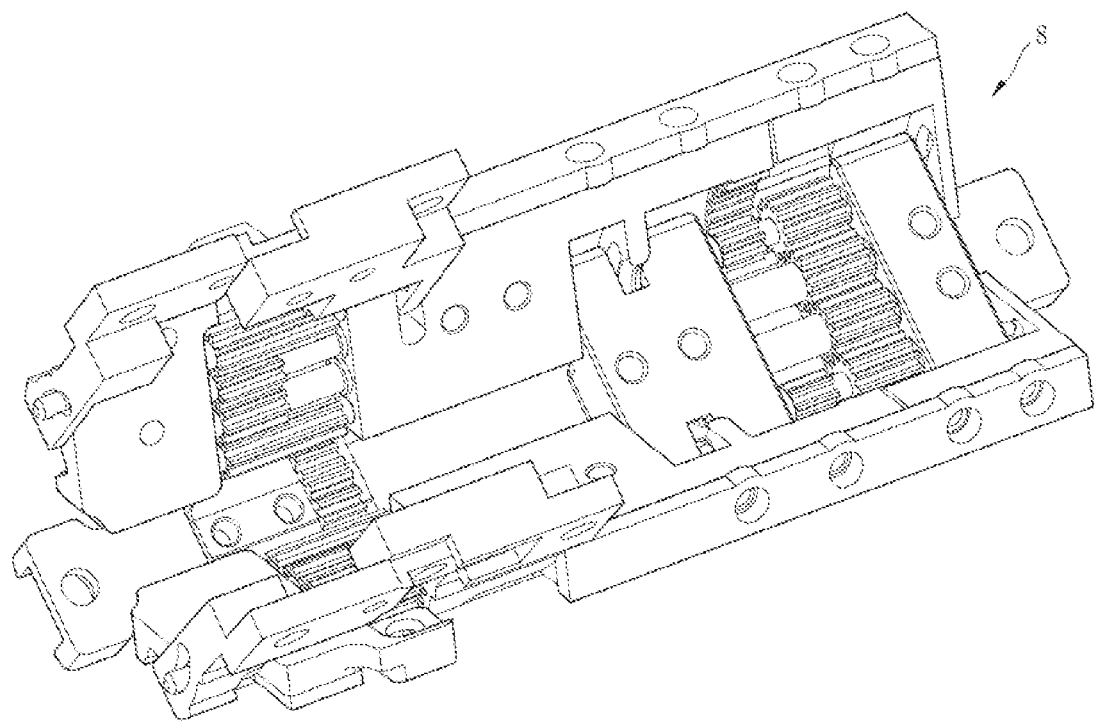
FIG. 7 shows the hinge in the folded state in the foldable display according to an embodiment of the present application.
Figure 8:
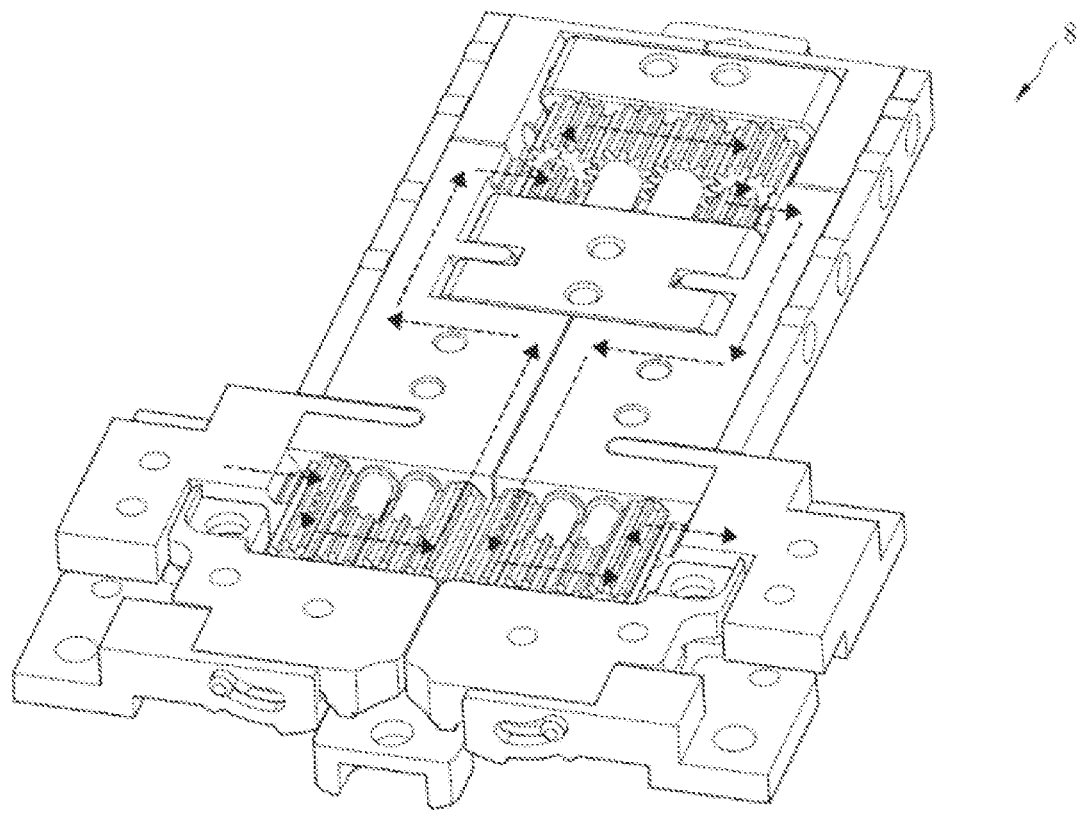
FIG. 8 is a schematic diagram of synchronous driving force transmission of the hinge in the foldable display according to an embodiment of the present application.

FIG. 7 shows the hinge in the folded state in the foldable display according to an embodiment of the present application, and FIG. 8 is a schematic diagram of synchronous driving force transmission of the hinge in the foldable display according to an embodiment of the present application. Please refer to FIG. 5, FIG. 7, and FIG. 8. In the embodiment of the application, the foldable mechanism 40 mainly involves synchronous driving force transmission of an internal hinge 8, comprising: meshing movements between a central bracket, a primary bracket, a secondary bracket and intermediate geartrains; the primary bracket and the secondary bracket conduct the overturning movement by sliding a rotating shaft in the limiting arc-shaped chute. The secondary bracket and the central bracket perform rotary movements through sliding a rotating shaft in the limited arc chute.

Please refer to FIG. 3. In the embodiment of the present application, a folded portion of the foldable mechanism 40 after folding is an arc surface.

Please refer to FIG. 1a and FIG. 2b. In the embodiment of the present application, the body 15 is provided with a camera 16, a USB interface 17, and a Bluetooth unit (not shown in the figure).

Referring to FIG. 2b, in the embodiment of the present application, the overall dimensions of the main screen 20 and the auxiliary screen 30 are equal, and the dimensions of the junctions thereof are equal.

This application completely subverts the industrial design of the traditional screen through the foldable display, bringing unprecedented changes in user experience and interaction. It is easy to carry and store in the folded state, and the high-quality whole screen experience can be obtained in the unfolded state. The two states can be switched to and from freely. The synchronous geartrain designed foldable mechanism is reliable and stable in the folding movement of the screens, and can rotate freely in a certain angle range. The synchronous gear folding display is uniformly fit in the folded state between the main screen shell and the auxiliary screen shell, as well as between the foldable mechanism and the screen. The visual effect of folding process is smooth and beautiful, and the bending performance requirements of folding terminal for screen is reduced.

The terms "in an embodiment" and "in various embodiments" are repeatedly used. The term usually does not refer to the same embodiment; however, it may also refer to the same embodiment. Words such as "contain", "have" and "comprise" are synonyms, unless the context shows other meanings.

The above is only the embodiment of the application, and is not intended to restrict the application in any form. Although the application has been disclosed by specific examples, it is not intended to limit the application. Any technical personnel who are familiar with the field can make some changes or modifications to equivalent changes by using the technical contents disclosed above within the scope of the technical solution of the application. However, any simple modification, equivalent change, and modification to the above embodiments according to the technical essence of the application shall still be within the scope of the technical solution of the application.

What is claimed is:

1. A foldable display comprising a body, a main screen, and an auxiliary screen, wherein:
    the main screen and the auxiliary screen are connected by
        a foldable mechanism transformable between a folded state and an unfolded state; and
    in the unfolded state, the main screen and the auxiliary screen are sided together to transform into a whole screen,
    wherein the foldable mechanism comprises:
        two synchronous geartrain hinges, configured to transmit forces by a plurality of gears;

a central folding joint, covered by the two synchronous geartrain hinges, arranged as a central part of a symmetric structure;

two secondary folding joints, fixed on either sides of the central folding joint by screws;

a head component and a tail component, respectively attached to the secondary folding joints by screws;

a shell of the main screen, attached to an outer side of the head component;

a shell of the auxiliary screen, attached to an outer side of the tail component; and a central cover plate, configured to cover the two synchronous geartrain hinges by screws, support the whole screen, and prevent the whole screen from contacting the gears, wherein each of the synchronous geartrain hinges are a symmetrical design comprising:
a central base;
an active primary bracket;
an active geartrain;
an active secondary bracket;
a passive secondary bracket;
a passive geartrain; and
a passive primary bracket.

2. The foldable display according to claim 1, wherein:
the auxiliary screen is located on the body,
in the folded state, the main screen is stacked on the auxiliary screen; and
a folded portion of the foldable mechanism is an arc surface.

3. The foldable display according to claim 1, wherein:
a middle portion of the whole screen is crimped and clung to an inner surface of the foldable mechanism; and
the body comprises a camera, a USB interface, and a Bluetooth unit.

4. The foldable display according to claim 1, wherein the main screen and the auxiliary screen are touch screens.

5. The foldable display according to claim 1, wherein the central base comprises:
a central rotating geartrain, comprising a main stay, a central driving geartrain composed of four central driving gears, and a pair of gear supporters supporting the four central driving gears, wherein:
the main stay has a bottom fixed on the central folding joint by screws, and
the main stay has racks axially symmetrically allocated on the main stay and below the active geartrain and the passive geartrain, respectively meshing with gears in the active geartrain and the passive geartrain.

6. The foldable display according to claim 5, wherein:
the active primary bracket comprises two brackets fixedly connected by screws;
a first end, having a limiting arc-shaped chute matched with a fixed shaft of the active secondary bracket for sliding on a fixed track, and
a second end directly fixedly attached to the tail component and the shell of the auxiliary screen by screws.

7. The foldable display according to claim 6, wherein the active geartrain comprises:
four active gears sequentially arranged and meshed in a row; wherein:
a front gear of the four active gears is meshed with racks on the active primary bracket, transmitting forces to a rear gear of the four active gears via intermediate gears of the four active gears; and the rear gear of the four active gears is meshed with racks on the main stay, driving the main stay to perform a rotational motion on the fixed track.

8. The foldable display according to claim 7, wherein the active secondary bracket comprises five brackets fixedly connected in a row, each respectively attached by screws to provide rotation support on either ends of the active geartrain, performing the rotational motion together with the rear gear meshed with the racks on the main stay.

9. The foldable display according to claim 8, wherein the passive secondary bracket comprises five brackets and is axially symmetric with the active secondary bracket.

10. The foldable display according to claim 9, wherein the passive geartrain comprises four passive gears sequentially arranged and meshed in a row, wherein a front gear of the four passive gears receives driving forces generated by overturning the passive secondary bracket, and transmits the driving forces to a rear gear of the four passive gears through intermediate gears of the four passive gears.

11. The foldable display according to claim 10, wherein the passive primary bracket comprises two brackets axially symmetrical with the active primary bracket;
a first end having a limiting arc-shaped chute matched with a fixed shaft of the passive secondary bracket to enable sliding on the fixed track;
a second end fixedly connected to the head component and the shell of the main screen; wherein one of the brackets of the passive primary bracket has racks meshed with the rear gear of the four passive gears so as to rotate responsively.

12. The foldable display according to claim 11, wherein during a folding process:
the tail component and the shell of the auxiliary screen are flipped by the driving forces, driving the active primary bracket to move along the limiting arc-shaped chute;
the racks on a bracket on the active primary bracket drive the active geartrain to rotate, so that the rear gear of the four passive gears meshed with the racks on the main stay is rotated to overturn the active secondary bracket along the limiting arc-shaped chute;
the racks on one of the brackets on the active secondary bracket synchronously drive a first one of the central driving gears to rotate, causing the racks on the main stay to transfer the driving forces from the first one of the central driving gears to a last one of the central driving gears, driving racks on a bracket on the passive secondary bracket meshed with the last one of the four central driving gears to move the passive secondary bracket along the limiting arc-shaped chute;
the racks of the main stay synchronously drive the front gear of the passive geartrain to rotate, causing the front gear to transfer the driving forces to the rear gear; and
the head component and the shell of the main screen are synchronously overturned by the driving forces transferred from the rear gear meshed with the racks on one of the brackets on the passive primary bracket.

13. The foldable display according to claim 1, wherein the main screen and the auxiliary screen have subsequently identical dimensions with junctions of same sizes.

14. A foldable display comprising a body, a main screen, and an auxiliary screen, wherein:
the main screen and the auxiliary screen are connected by a foldable mechanism transformable between a folded state and an unfolded state; and
in the unfolded state, the main screen and the auxiliary screen are sided together to transform into a whole screen, wherein the foldable mechanism comprises:
two synchronous geartrain hinges, configured to transmit forces by a plurality of gears;
a central folding joint, covered by the two synchronous geartrain hinges, arranged as a central part of a symmetric structure;
two secondary folding joints, fixed on either sides of the central folding joint by screws;
a head component and a tail component, respectively attached to the secondary folding joints by screws;
a shell of the main screen, attached to an outer side of the head component;
a shell of the auxiliary screen, attached to an outer side of the tail component; and
a central cover plate, configured to cover the two synchronous geartrain hinges by screws, support the whole screen, and prevent the whole screen from contacting the gears,
during a folding process, the shell of the main screen is kept relatively still;
the driving forces are applied on the shell of the auxiliary screen, driving the foldable mechanism to fold, so that the inner surface of the foldable mechanism is bended to form an arc surface with a circumference equal to a length of the inner surface of the foldable mechanism in the unfolded state, allowing lengths of the shells of the auxiliary screen and the main screen and the inner surface of the foldable mechanism to remain unchanged during the folding process.

15. A foldable display, comprising a body, a main screen, and an auxiliary screen, wherein:
the main screen and the auxiliary screen are connected by a foldable mechanism transformable between a folded state and an unfolded state;
in the unfolded state, the main screen and the auxiliary screen are sided together to transform into a whole screen, and the auxiliary screen is located on the body; and
in the folded state, the main screen is stacked on the auxiliary screen, and a middle portion of the whole screen is crimped and clung to an inner surface of the foldable mechanism,
wherein the foldable mechanism comprises:
two synchronous geartrain hinges, configured to transmit forces by a plurality of gears;
a central folding joint, covered by the two synchronous geartrain hinges, arranged as a central part of a symmetric structure;
two secondary folding joints, fixed on either sides of the central folding joint by screws;
a head component and a tail component, respectively attached to the secondary folding joints by screws;
a shell of the main screen, attached to an outer side of the head component;
a shell of the auxiliary screen, attached to an outer side of the tail component; and
a central cover plate, configured to cover the two synchronous geartrain hinges by screws, support the whole screen, and prevent the whole screen from contacting the gears,
wherein each of the synchronous geartrain hinges are a symmetrical design comprising:
a central base;
an active primary bracket;
an active geartrain;
an active secondary bracket;
a passive secondary bracket;
a passive geartrain; and
a passive primary bracket.

16. The foldable display according to claim 15, wherein:
the auxiliary screen is located on the body;
in the folded state, the main screen is stacked on the auxiliary screen; and
the middle portion of the whole screen is crimped and clung to the inner surface of the foldable mechanism.

* * * * *